United States Patent
Kim et al.

(10) Patent No.: US 9,064,895 B2
(45) Date of Patent: Jun. 23, 2015

(54) VERTICAL MEMORY DEVICES AND METHODS OF MANUFACTURING THE SAME

(71) Applicants: Bi-O Kim, Seoul (KR); Toshiro Nakanishi, Seongnam-si (KR); Jin-Tae Noh, Suwon-si (KR); Chang-Woo Sun, Hwaseong-si (KR); Seung-Hyun Lim, Seoul (KR); Jae-Young Ahn, Seongnam-si (KR); Ki-Hyun Hwang, Seongnam-si (KR)

(72) Inventors: Bi-O Kim, Seoul (KR); Toshiro Nakanishi, Seongnam-si (KR); Jin-Tae Noh, Suwon-si (KR); Chang-Woo Sun, Hwaseong-si (KR); Seung-Hyun Lim, Seoul (KR); Jae-Young Ahn, Seongnam-si (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/943,911

(22) Filed: Jul. 17, 2013

(65) Prior Publication Data

US 2014/0024189 A1 Jan. 23, 2014

(30) Foreign Application Priority Data

Jul. 20, 2012 (KR) ........................ 10-2012-0079541

(51) Int. Cl.
  *H01L 27/115* (2006.01)
  *H01L 29/66* (2006.01)
  *H01L 21/8239* (2006.01)
  *H01L 29/788* (2006.01)
  *H01L 29/792* (2006.01)

(52) U.S. Cl.
  CPC ...... *H01L 29/66666* (2013.01); *H01L 21/8239* (2013.01); *H01L 27/1157* (2013.01); *H01L 27/11582* (2013.01); *H01L 29/66825* (2013.01); *H01L 29/66833* (2013.01); *H01L 29/7889* (2013.01); *H01L 29/7926* (2013.01)

(58) Field of Classification Search
  CPC .................... H01L 21/02518; H01L 21/8239; H01L 27/11213; H01L 27/11273; H01L 27/11563
  See application file for complete search history.

(56) References Cited

U.S. PATENT DOCUMENTS

| | | | |
|---|---|---|---|
| 7,696,559 B2 | 4/2010 | Arai et al. | |
| 8,048,743 B2 | 11/2011 | Lee et al. | |
| 8,063,438 B2 | 11/2011 | Son et al. | |
| 8,395,206 B2 | 3/2013 | Lee et al. | |
| 2009/0278193 A1 | 11/2009 | Murata et al. | |
| 2011/0032772 A1 | 2/2011 | Aritome | |
| 2011/0073866 A1 | 3/2011 | Kim et al. | |
| 2011/0248327 A1 | 10/2011 | Son et al. | |
| 2011/0303971 A1* | 12/2011 | Lee et al. | 257/324 |
| 2012/0086282 A1 | 4/2012 | Lee | |

FOREIGN PATENT DOCUMENTS

| | | |
|---|---|---|
| JP | 2010-093269 | 4/2010 |
| KR | 1073640 | 11/2010 |
| KR | 10-2010-0127111 | 12/2010 |
| KR | 10-2011-0064551 | 6/2011 |
| KR | 10-2011-0119156 | 11/2011 |

\* cited by examiner

*Primary Examiner* — Cheung Lee
(74) *Attorney, Agent, or Firm* — Myers Bigel Sibley & Sajovec

(57) ABSTRACT

Methods of fabricating vertical memory devices are provided including forming a plurality of alternating insulating layers and sacrificial layers on a substrate; patterning and etching the plurality of insulating layer and sacrificial layers to define an opening that exposes at least a portion of a surface of the substrate; forming a charge trapping pattern and a tunnel insulating pattern on a side wall of the opening; forming a channel layer on the tunnel insulating layer on the sidewall of the opening, the channel layer including N-type impurity doped polysilicon; forming a buried insulating pattern on the channel layer in the opening; and forming a blocking dielectric layer and a control gate on the charge trapping pattern of one side wall of the channel layer.

14 Claims, 11 Drawing Sheets

VERTICAL MEMORY DEVICES AND METHODS OF MANUFACTURING THE SAME

CROSS-REFERENCE TO RELATED APPLICATION

This application claims priority under 35 USC §119 to Korean Patent Application No. 10-2012-0079541 filed Jul. 20, 2012 in the Korean Intellectual Property Office (KIPO), the entire disclosure of which is incorporated herein by reference as if set forth in its entirety.

FIELD

The present inventive concept relates generally to vertical memory devices and, more particularly, to vertical NAND flash memory devices and methods of manufacturing the same.

BACKGROUND

Recently, vertical memory devices have been used to increase stacking degrees. In vertical memory devices, a plurality of memory cells and insulating layers may be stacked vertically on the surface of a substrate. Furthermore, channel patterns having a pillar or macaroni shape vertically extruded with respect to the substrate may be provided. According to the material and the structure of the channel patterns, electrical operating characteristics of memory cells included in the vertical memory devices may be changed.

SUMMARY

Some embodiments of the present inventive concept provide methods of fabricating a vertical memory device. The method includes forming a plurality of alternating insulating layers and sacrificial layers on a substrate; patterning and etching the plurality of insulating layer and sacrificial layers to define an opening that exposes at least a portion of a surface of the substrate; forming a charge trapping pattern and a tunnel insulating pattern on a side wall of the opening; forming a channel layer on the tunnel insulating layer on the sidewall of the opening, the channel layer including N-type impurity doped polysilicon; forming a buried insulating pattern on the channel layer in the opening; and forming a blocking dielectric layer and a control gate on the charge trapping pattern of one side wall of the channel layer.

In further embodiments, forming the channel layer may include depositing an N-type impurity doped amorphous silicon layer on the tunnel insulating layer, wherein depositing includes in situ doping; forming a polysilicon layer by crystallization of the amorphous silicon layer; and partially etching the polysilicon layer to provide the channel layer having a thickness that is smaller than a thickness of the polysilicon layer. The crystallization process may include a thermal treatment process. Partially etching the polysilicon layer may include isotropically etching the polysilicon layer.

In still further embodiments, forming of the channel layer may include forming an undoped amorphous silicon layer on the tunnel insulating pattern; implanting N-type impurities into the undoped amorphous silicon layer to provide a doped amorphous silicon layer; crystallizing the doped amorphous silicon layer to form a polysilicon layer; and partially etching the polysilicon layer to provide the channel layer.

In some embodiments, doping of the N-type impurities may include a gas phase doping process. In these embodiments, the doping gas used in the gas phase doping process may be Phosphine ($PH_3$).

In further embodiments, the crystallization process may include a thermal treatment process.

In still further embodiments, partially etching the polysilicon layer may include isotropically etching the polysilicon layer.

In some embodiments, the N-type impurities implanted in the channel layer may include phosphor.

In further embodiments, the doping concentration of the N-type impurities implanted in the channel layer may be from about $5 \times 10^{18}$ atoms/cm$^3$ to about $2 \times 10^{20}$ atoms/cm$^3$.

In still further embodiments, the channel layer may have a thickness of from about 30 Å to about 90 Å.

Some embodiments of the present inventive concept provide methods of fabricating a vertical memory device. The method includes forming a plurality of alternating insulating layers and sacrificial layers on a substrate; patterning and etching the plurality of insulating layer and sacrificial layers to define an opening that exposes at least a portion of a surface of the substrate; forming a charge trapping pattern and a tunnel insulating pattern on a side wall of the opening; and forming a channel layer on the tunnel insulating pattern, the channel layer having a thickness of from about 30 Å to about 90 Å and a doping concentration from about $5 \times 10^{18}$ atoms/cm$^3$ to about $2 \times 10^{20}$ atoms/cm$^3$.

DETAILED DESCRIPTION OF THE EMBODIMENTS

Figure 1:
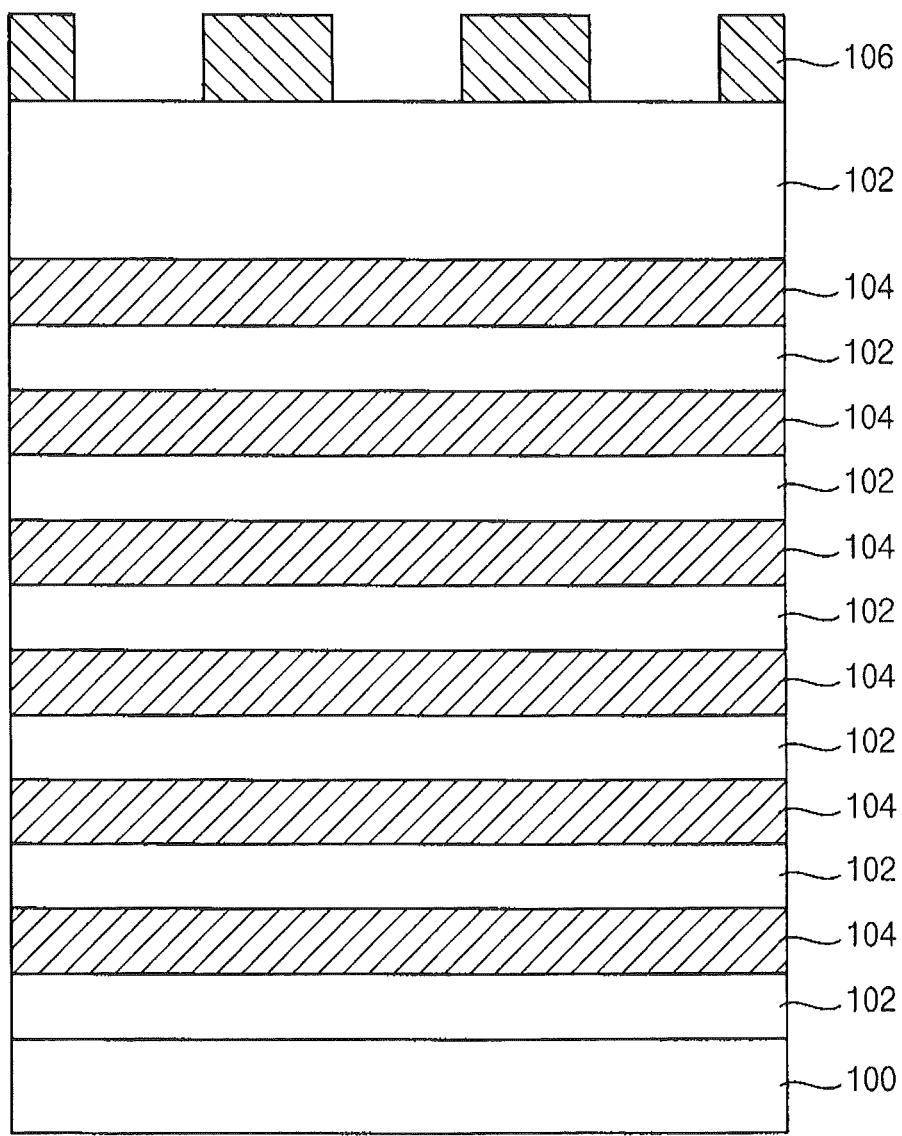
FIGS. 1 to 7 are cross-sections illustrating processing steps in the fabrication of vertical memory devices in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present inventive concept will now be discussed with respect to FIGS. 1 though 12 below. FIGS. 1 to 7 are cross-sections illustrating processing steps in the fabrication of vertical memory devices in accordance with some embodiments of the present inventive concept. Referring first to FIG. 1, a plurality of insulating interlayers 102 and sacrificial layers 104 may be alternately stacked on a substrate 100. The substrate 100 may include a semiconductor material, such as silicon, germanium, and the like.

The insulating interlayer 102 may be formed using a silicon oxide compound, such as silicon oxide ($SiO_2$), silicon oxycarbide (SiOC) or silicon oxyfluoride (SiOF). The sacrificial layer 104 may be formed using a material having an etching selectivity with respect to the insulating interlayer 102. In particular, the sacrificial layer 104 may be formed by using a silicon nitride compound, such as silicon nitride (SiN), silicon boron nitride (SiBN), and the like. Furthermore, the insulating interlayer 102 and the sacrificial layer 104 may be formed using, for example, a chemical vapor deposition (CVD) process, a plasma enhanced chemical vapor deposition (PECVD) process, an atomic layer deposition (ALD) process, and the like. The sacrificial layer 104 may be provided as a layer for forming gates constituting each of the memory cells and selection transistors. Thus, the thickness of the sacrificial layer 104 formed at each layer may be almost the same as the target thickness of a gate electrode formed in each of the layers.

Figure 2:
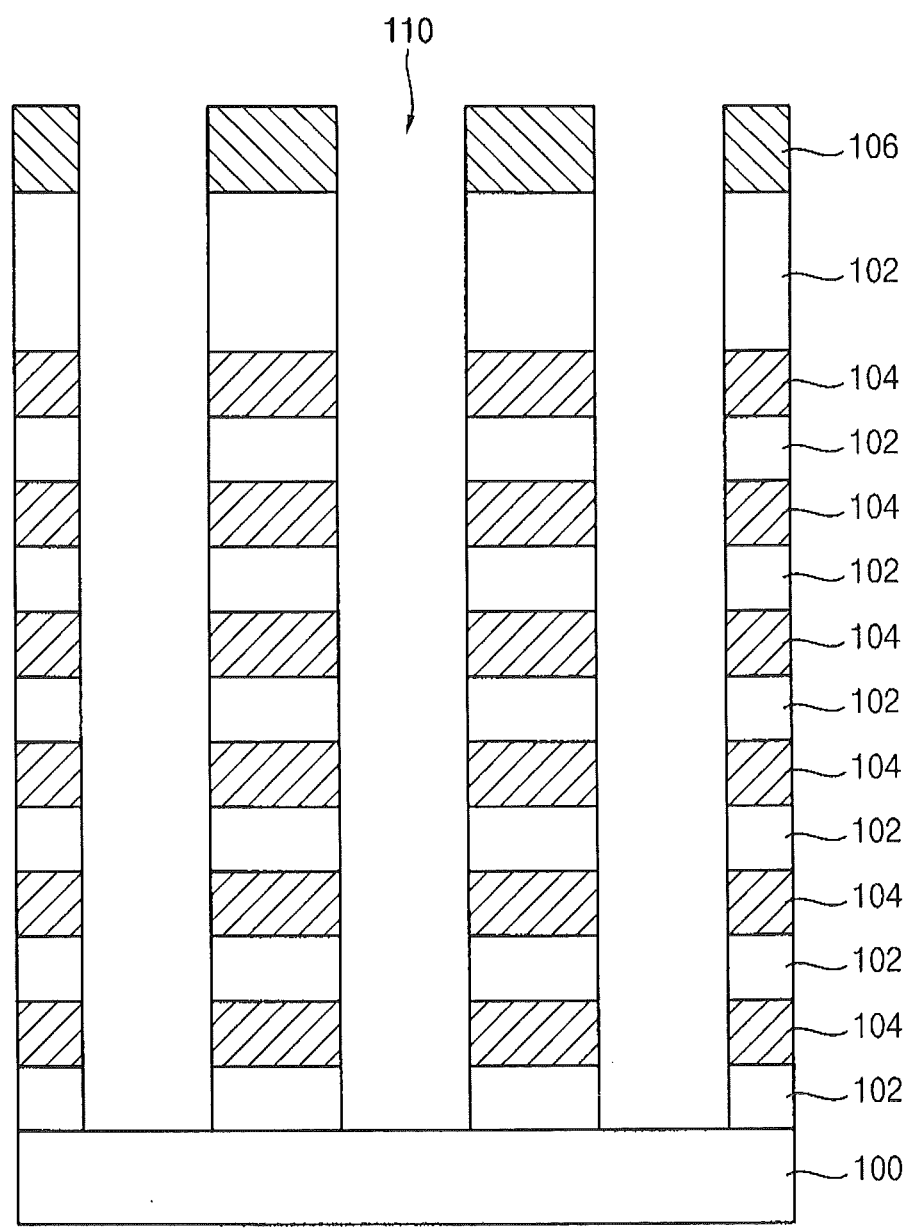

As further illustrated in FIG. 1, a mask pattern 106 may be formed on the resulting structure. As illustrated in FIG. 2, a dry etching process may be performed using the mask pattern 106 as an etching mask to form first opening portions 110 having a contact hole shape exposing the surface of the substrate 100 through the insulating interlayers 102 and the sacrificial layers 104. The first opening portions 110 may form regions of the channels of cell transistors in following processes.

In some embodiments, semiconductor patterns contacting the surface of the substrate 100 may be additionally formed on the surface of the substrate 100. In these embodiments, the semiconductor pattern may be formed by a selective epitaxial growth process.

Figure 3:
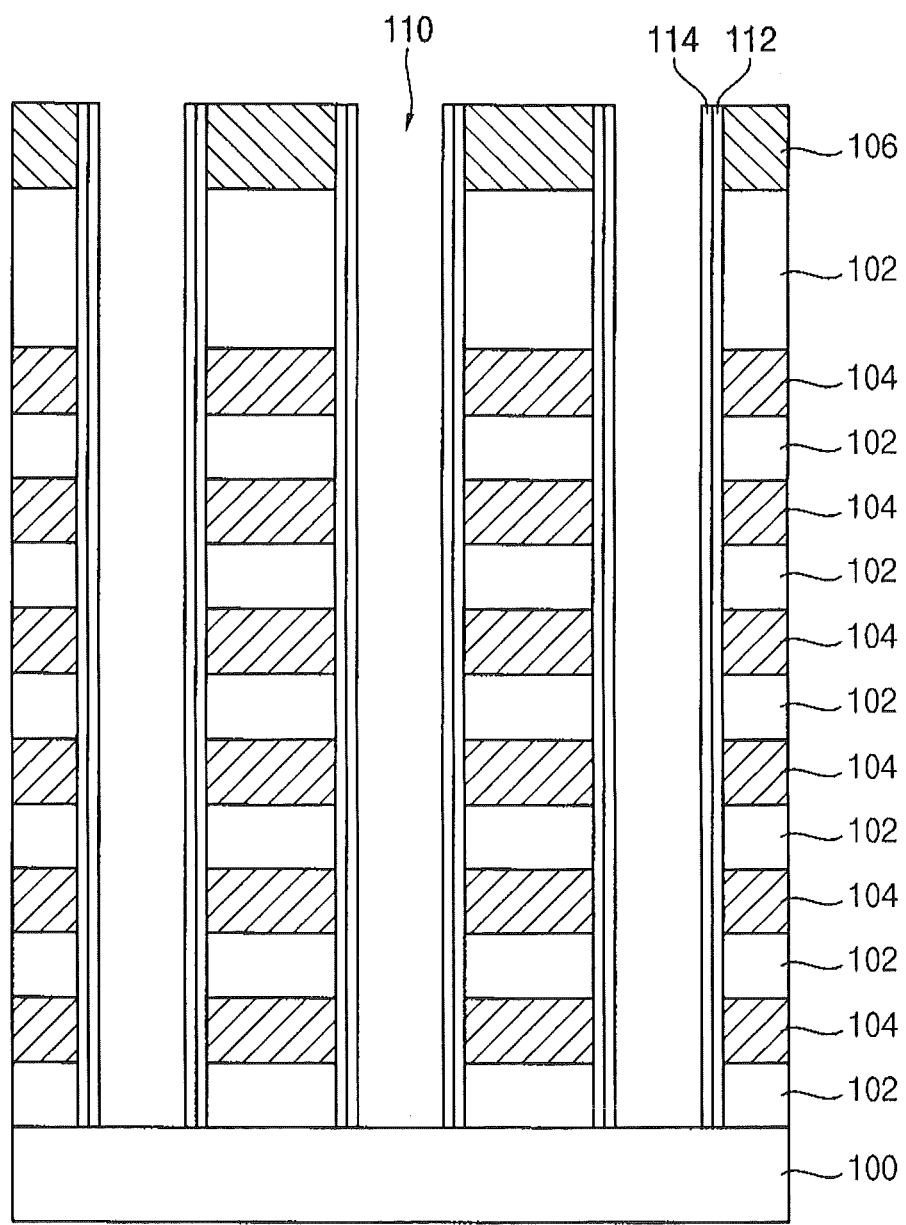

Referring now to FIG. 3, a charge trapping layer and a tunnel insulating layer may be conformally formed sequentially along the profile of the side wall of the first opening portion 110 and the surface of the substrate. An oxide layer may be provided as a portion of a blocking dielectric prior to forming the charge trapping layer.

The charge trapping layer may include a nitride, such as silicon nitride or a metal oxide, on the side wall of the first opening portion 110, and on the upper surface of the substrate and the insulating interlayer. Furthermore, the tunnel insulating layer may include, for example, silicon oxide formed by a CVD process, an ALD process, and the like. In some embodiments, a polysilicon layer may be formed to a relatively small thickness on the tunnel insulating layer to passivate the tunnel insulating layer.

The tunnel insulating layer and the charge trapping layer may be etched, for example, anisotropically etched, to expose a surface portion of the substrate 100. On a side wall of the first opening portion 110, a charge trapping pattern 112 and a tunnel insulating layer pattern 114 having a spacer shape may be formed as illustrated in FIG. 3.

Figure 4:
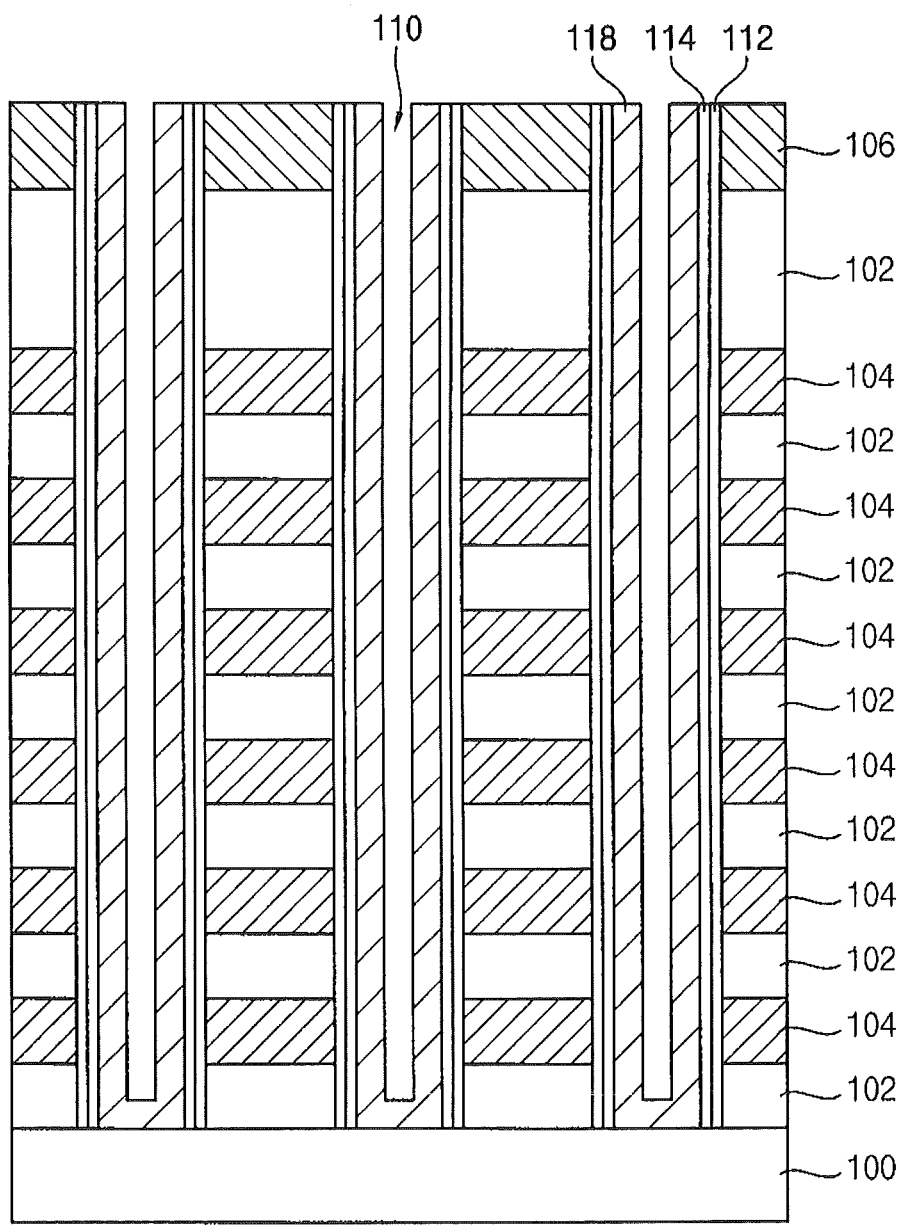

Referring now to FIG. 4, an amorphous silicon layer 118 may be formed along the surface profile of the tunnel insulating layer pattern 114 and the substrate 100 by, for example, a depositing process including an in situ doping of N-type impurities. The N-type impurities may include, for example, phosphor or arsenic. In some embodiments, the phosphor may be used as the N-type impurities. The amorphous silicon layer 118 may not completely fill up the inner portion of the first openings 110 but may be formed along the side wall and the bottom surface of the first opening portions 110.

The amorphous silicon layer 118 may be provided as the channel layer of memory cells through subsequent processes. The operating characteristics of the cell transistor may be changed according to the impurities doped into the amorphous silicon layer 118. Thus, the concentration of the impurities doped into the amorphous silicon layer 118 may be controlled so that the memory cells may have a target threshold voltage.

In some embodiments, a cell transistor may be generated from the opposite face of the tunnel insulating layer pattern 114 when a voltage higher than the threshold voltage is applied to the gate of the cell transistor. In other words, the cell transistor may be a depletion type transistor. Therefore, the concentration of the impurities in the channel layer of the cell transistor may be controlled to form the depletion type transistor. Particularly, as the doped concentration of the impurities of the channel layer increases in the cell transistor, the threshold voltage characteristics of the cell transistor may be deteriorated.

In particular, when the concentration of the N-type impurities (that is, the concentration of the phosphor) is higher than $2\times10^{20}$ atoms/cm$^3$, on/off properties may deteriorate, and the operation as the cell transistor may be difficult. On the contrary, when the concentration of the N-type impurities is lower than $5\times10^{18}$ atoms/cm$^3$, on current of the cell transistor may be undesirably too low. Furthermore, the doping of the impurities having a low concentration through the in situ doping may be difficult. Thus, the formation of the amorphous silicon layer 118 having a doping concentration lower than $5\times10^{18}$ atoms/cm$^3$ through the in situ process may be difficult. Therefore, the concentration of the N-type impurities may be from about $5\times10^{18}$ atoms/cm$^3$ to about $2\times10^{20}$ atoms/cm$^3$.

The amorphous silicon layer 118 may be formed to have a thickness greater than the channel layer to be finally formed. Since the finally formed channel layer may be have a relatively small thickness of, for example, about 90 Å or less, the formation of the amorphous silicon layer to a small thickness while having a uniform doping concentration may be difficult. Particularly, the amorphous silicon layer 118 may be formed to a thickness of from about 150 Å to about 300 Å so as to have a uniform thickness and a uniform doping concentration. Since the amorphous silicon layer 118 may have a thickness so as not to completely fill up the inner portion of the first opening portion 110, the thickness of the amorphous silicon layer 118 may not be defined within the above-described range. The thickness of the amorphous silicon layer 118 may be changed according to the inner width of the first opening portion 110.

Figure 5:
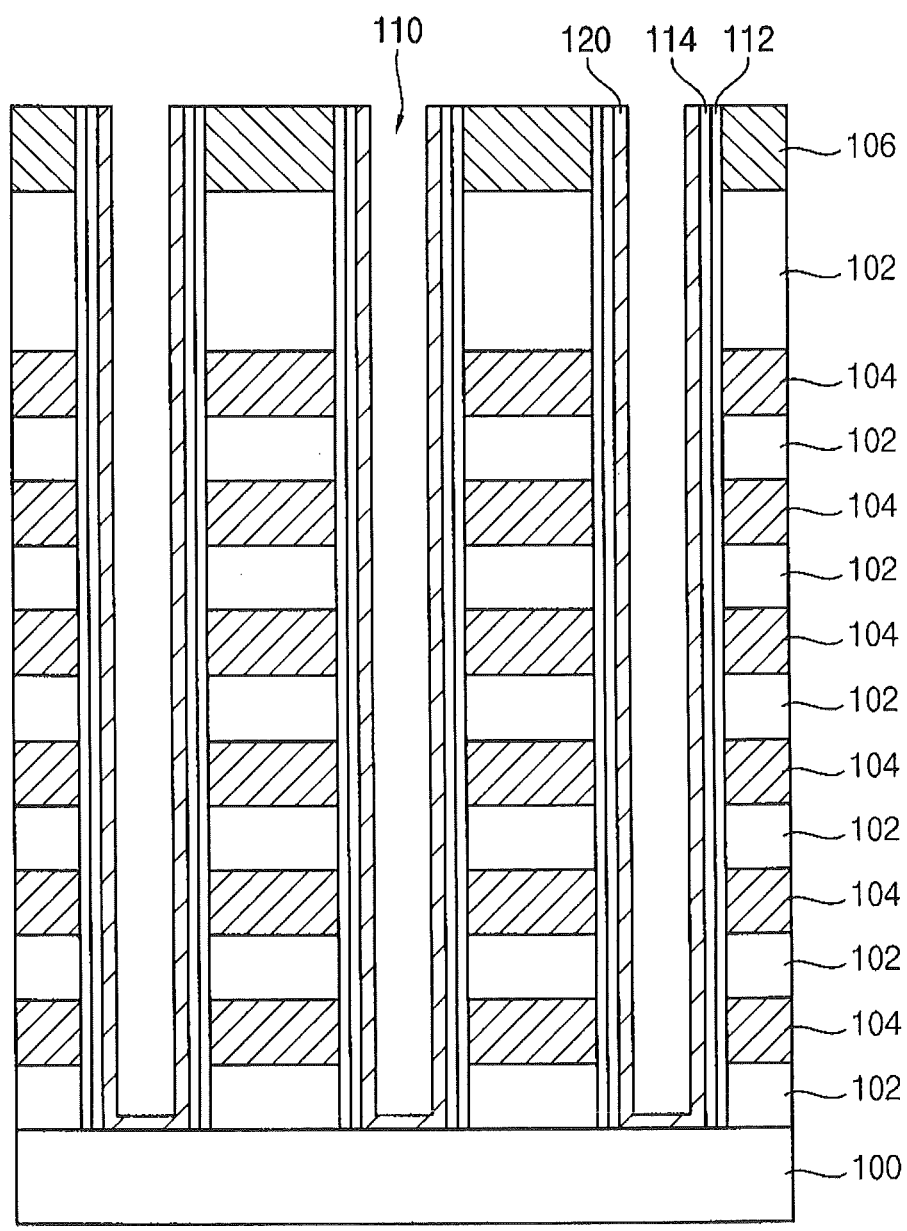

Referring now to FIG. 5, the amorphous silicon layer 118 may be crystallized to form a polysilicon layer. The crystallization process may include a thermal treatment process. Through conducting the crystallization process, the N-type impurities in the polysilicon layer may have a uniform doping profile.

Then, the polysilicon layer may be partially etched to a certain thickness to decrease the thickness of the polysilicon layer to form a channel layer 120. The etching process may be an isotropic etching process.

The thickness of the channel layer 120 may dominantly affect the operating characteristics of the cell transistor. Particularly, as the thickness of the channel layer 120 decreases, the threshold voltage may be increased and the swing properties may be improved. As discussed above, the operating characteristics of the cell transistor may change according to the doping concentration of the channel layer 120 and the thickness of the channel layer 120. Thus, a cell transistor having desired operating characteristics may be formed by appropriately changing the doping concentration of the channel layer 120 and the thickness of the channel layer 120. Particularly, when the concentration of the N-type impurities of the channel layer 120 is somewhat high, the thickness of the channel layer 120 may be preferably decreased. On the contrary, when the concentration of the N-type impurities of the channel layer 120 is low, the thickness of the channel layer 120 may be slightly increased.

As discussed above, when the concentration of the N-type impurities is within the range of about $5\times10^{18}$ atoms/cm$^3$ to about $2\times10^{20}$ atoms/cm$^3$, and the thickness of the channel layer 120 is about 90 Å or over, the operation as a cell transistor may be difficult. That is, when the thickness of the channel layer 120 is about 90 Å or over, the threshold voltage characteristics and the swing properties may not be adequate and on/off characteristics may deteriorate. Meanwhile, when the thickness of the channel layer 120 is about 30 Å or less, the on current of the cell transistor may be largely decreased. Furthermore, the control of the etching process so that the channel layer 120 may have a small thickness of 30 Å or less may be difficult. Thus, the etching process may be conducted so that the channel layer 120 may have a thickness of from about 30 Å to about 90 Å.

In some embodiments, the amorphous silicon layer 118 may be formed to have substantially the same thickness of the channel layer 120 to be finally formed. That is, the amorphous silicon layer 118 may be formed to have a thickness of from about 30 Å to about 90 Å. In these embodiments, the process of decreasing the thickness of the polysilicon layer by partially etching the polysilicon layer may be omitted.

Figure 6:
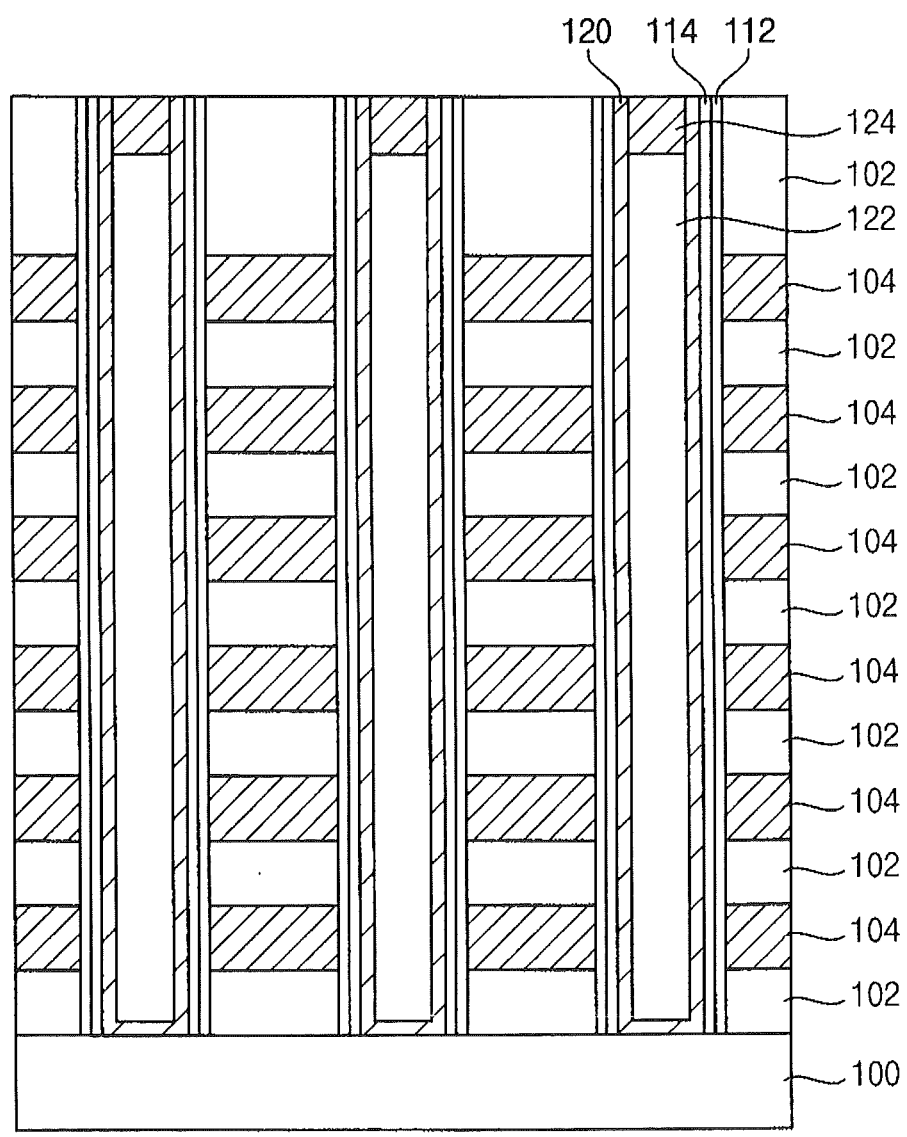

Referring now to FIG. 6, a buried insulating layer filling up the inner portion of the first opening portion 110 may be formed on the channel layer 120. The buried insulating layer may include, for example, silicon oxide. Through conducting a planarization process, the buried insulating layer positioned on the insulating interlayer 102 may be removed. The upper portion of the buried insulating layer may be partially removed to form a buried insulating pattern 122 as illustrated in FIG. 6. A conductive material layer filling up the removed portion of the buried insulating layer may be formed to provide a pad pattern 124 on the buried insulating pattern 122.

Figure 7:
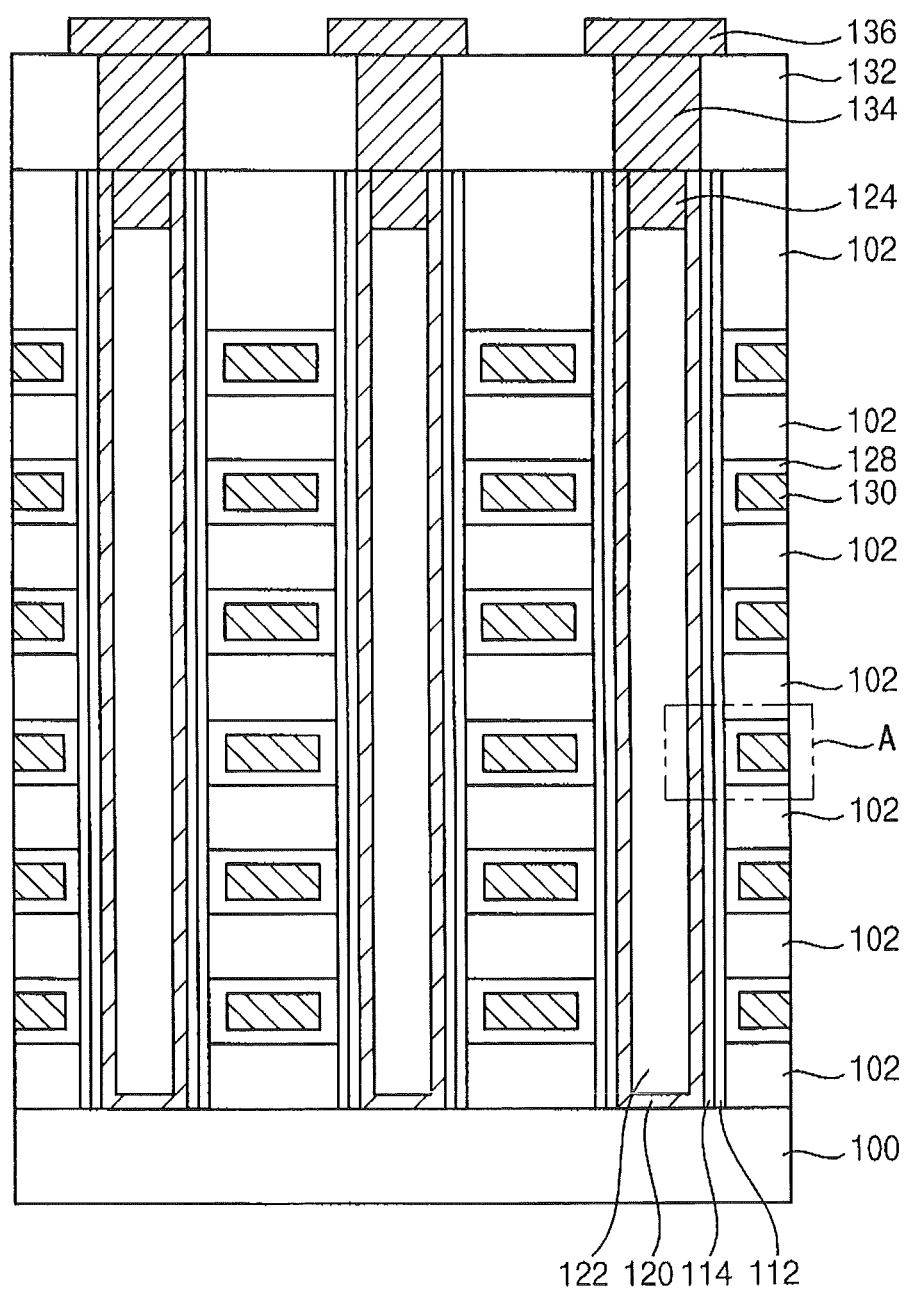

Referring now to FIG. 7, the insulating interlayers 102 and the sacrificial layers 104 may be partially dry etched to form a second opening portion. The second opening portion may have a trench shape that extends in a single direction.

The sacrificial layers 104 exposed through the side wall of the second opening portion may be removed to form a concave portion between the insulating interlayers 102. Through the concave portion, the charge trapping pattern 112 may be exposed. The removing process may be conducted by a wet etching process.

A blocking dielectric layer 128 may be formed on the exposed charge trapping pattern 112 exposed through the side wall of the concave portion. The blocking dielectric layer 128 may be conformally formed along the surface of the insulating interlayer 102, the substrate 100 and the charge trapping pattern 112. The blocking dielectric layer 128 may include, for example, a silicon oxide or a metal oxide. Examples of the metal oxide used for the blocking dielectric layer may include, but are not limited to, aluminum oxide, hafnium oxide, lanthanum oxide, lanthanum aluminum oxide, lanthanum hafnium oxide, hafnium aluminum oxide, titanium oxide, tantalum oxide, zirconium oxide, and the like. In some embodiments, the blocking dielectric layer 128 may be formed as a stacked multilayer of a silicon oxide layer and a metal oxide layer.

A gate electrode layer filling up the inner portion of the concave portion may be formed. Furthermore, the gate electrode layer may be partially etched to form a third opening portion to separate the gate electrode layers by each layer. Through the etching process, gate electrodes 130 may be formed. The gate electrode 130 may be provided as a ground selection line (GSL), a word line and a string selection line (SSL).

Meanwhile, impurities may be doped into the exposed substrate through the bottom portion of the third opening portion to form an impurity region. The impurity region may be provided as a common source line (CSL). Subsequently, an insulating layer pattern filling up the inner portion of the third opening portion may be formed.

An upper insulating interlayer 132 covering the pad pattern 124 may be formed. A bit line contact 134 contacting the pad pattern 124 and a bit line 136 may be formed through the upper insulating interlayer 132. The bit line 136 may be extended to a vertical direction to the extended direction of the gate electrode in each layer.

Thus, embodiments of the present inventive concept discussed with respect to FIGS. 1 through 7 provide a vertical memory device. The vertical memory device may have improved swing properties and threshold voltage characteristics.

Figure 8A:
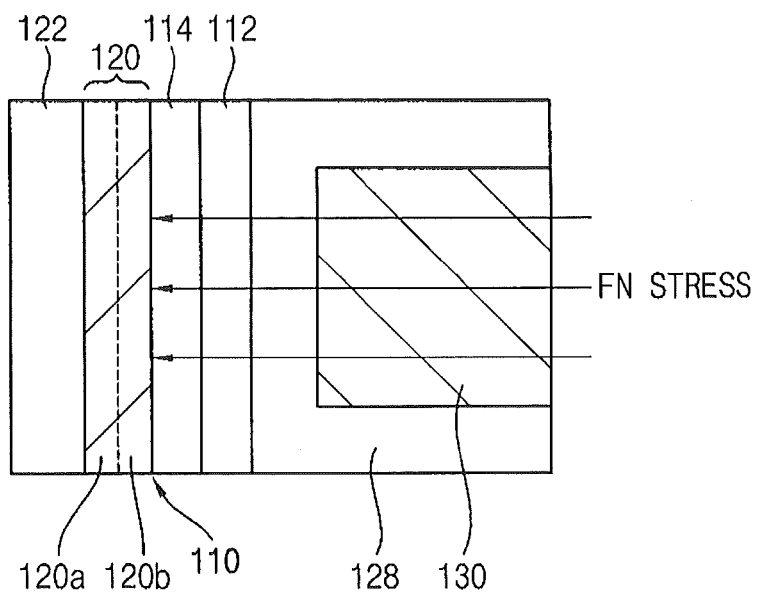
FIG. 8A is an enlarged cross-section of a cell transistor corresponding to part A of FIG. 7 in accordance with some embodiments of the present inventive concept.

Operations of vertical memory devices in accordance with some embodiments of the present inventive concept will be discussed. Referring first to FIG. 8A, an enlarged cross-section of a cell transistor corresponding to part A in FIG. 7 will be discussed. As illustrated in FIG. 8A, a current may not flow while applying a voltage less than a threshold voltage in the gate electrode of the cell transistor. Furthermore, when the voltage higher than the threshold voltage is applied to the gate electrode of the cell transistor, a depletion layer may be maintained at the channel layer portion 120b contacting the tunnel insulating layer pattern 114, while an N+ channel may be generated to flow the current at the channel layer portion 120a contacting the buried insulating pattern 122. Thus, a property of interface portion between the channel layer 120 and the buried insulating pattern 122 may affect the swing properties of the cell transistor. However, defects such as deterioration by an F-N tunneling may not be generated at the interface portion between the channel layer 120 and the buried insulating pattern 122. Therefore, the interface portion between the channel layer 120 and the buried insulating pattern 122 may have adequate interface properties. Thus, the swing properties and the threshold voltage characteristics of the cell transistor in some embodiments may be improved.

Figure 8B:
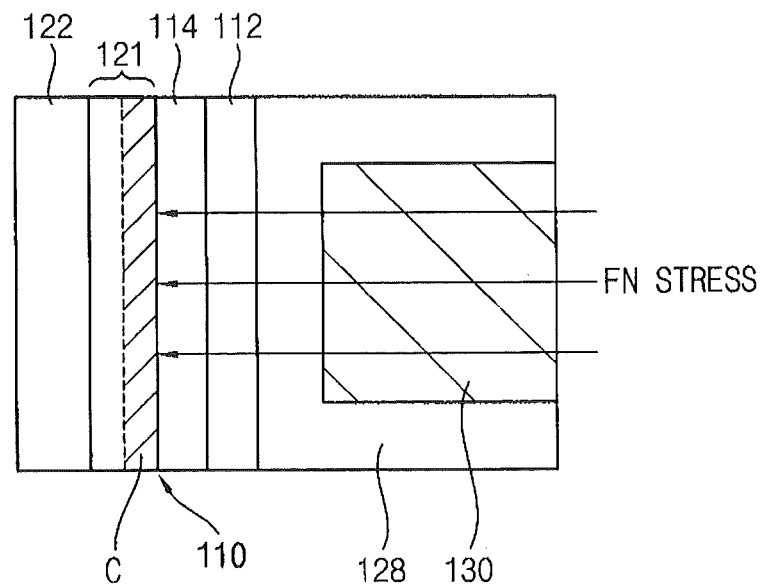
FIG. 8B is an enlarged cross-section of a common vertical memory device for comparison with embodiments of the present inventive concept.

Referring now to FIG. 8B, an enlarged cross-section of a common vertical memory device for the comparison with devices in accordance with embodiments discussed herein will be discussed. As illustrated in FIG. 8B, a cell transistor including an undoped channel layer different from some embodiments are explained. A channel (C) may be formed at the channel layer 121 portion contacting the tunnel insulating layer pattern 114, and a property of the interface portion between the channel layer 121 and the tunnel insulating layer pattern 114 may affect the swing properties of the cell transistor. However, since the F-N tunneling may be continuously generated at the interface portion between the channel layer 121 and the tunnel insulating layer pattern 114 during operation of the cell transistor, the interface portion between the channel layer 121 and the tunnel insulating layer pattern 114 may be deteriorated. Thus, the property of the interface portion between the channel layer 121 and the tunnel insulating layer pattern 114 may be deteriorated, and so, the swing properties of the cell transistor may be poor.

Figure 9:
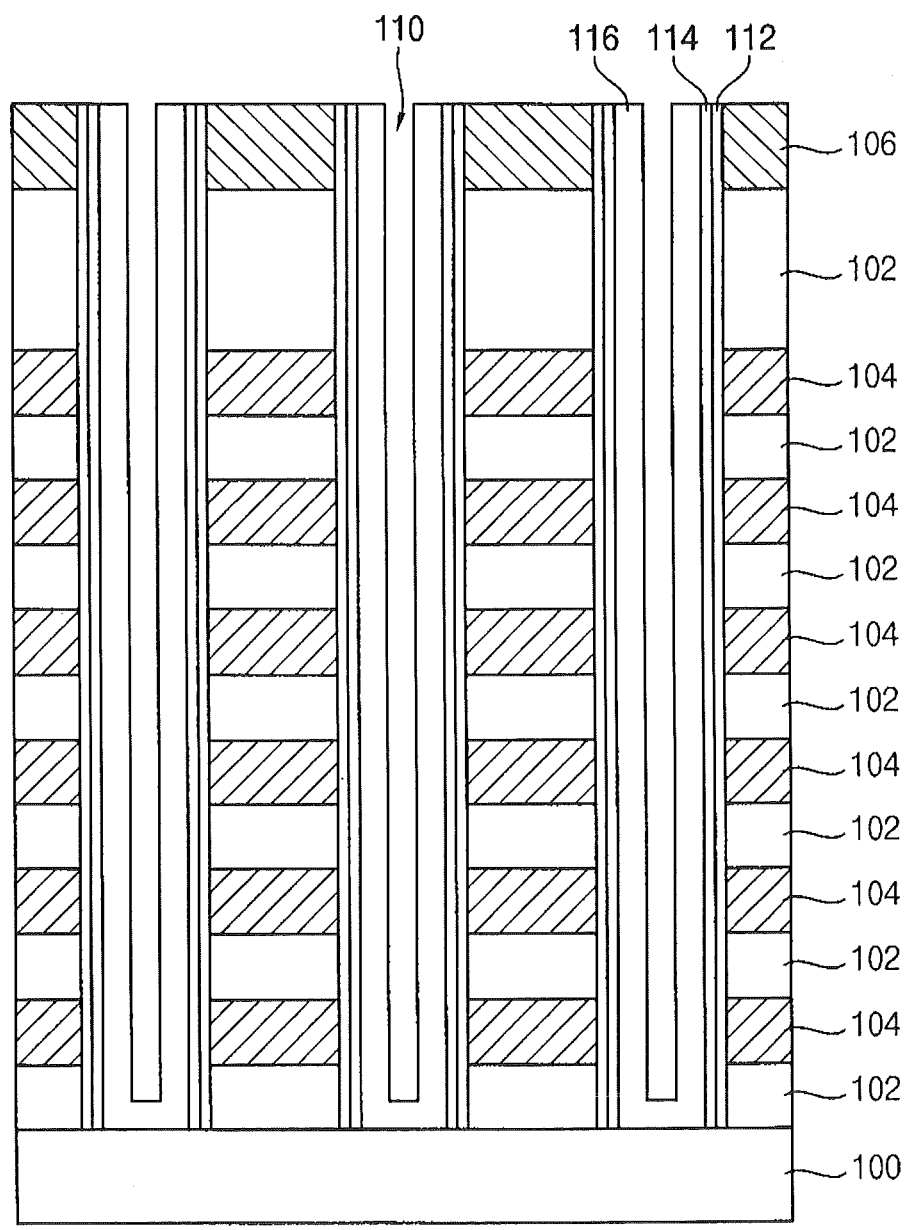
FIGS. 9 and 10 are cross-sections illustrating processing steps in the fabrication of vertical memory devices in accordance with some embodiments of the present inventive concept.
Figure 10:
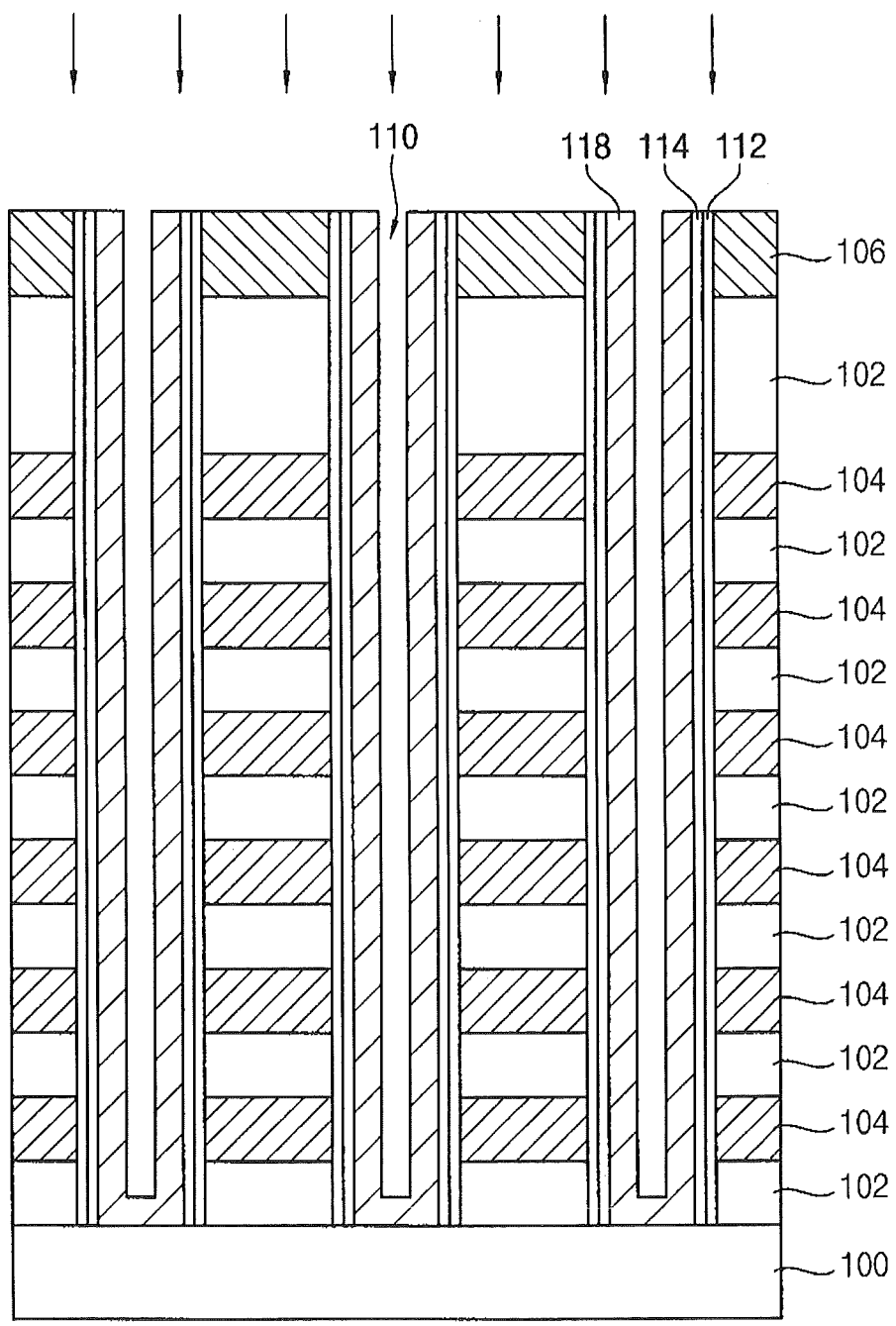

Referring now to FIGS. 9 and 10, cross-sections illustrating processing steps in the fabrication of vertical memory devices in accordance with some embodiments of the present inventive concept will be discussed. Processing steps in the manufacturing of devices illustrated in FIGS. 9 and 10 are similar to those discussed above with respect to FIGS. 1 through 7 except for processing steps used in the formation of the channel layer. Thus, details of the remaining processes may be omitted in the interest of brevity.

In particular, the structure illustrated in FIG. 3 may be formed by conducting the a similar process discussed with respect to FIGS. 1 through 3. Referring now to FIG. 9, an undoped amorphous silicon layer 116 may be formed along the surface profile of the tunnel insulating layer pattern 114 and the substrate 100. The amorphous silicon layer 116 may not completely fill up the inner portion of the first opening portions 110, but may be formed along the side wall and the bottom surface of the first opening portions 110.

The amorphous silicon layer 116 may be formed to a thickness greater than a thickness of a final amorphous silicon layer 116 to be formed. Since the finally formed amorphous silicon layer 116 may have a relatively small thickness of from about 90 Å or less, the formation of the amorphous silicon layer having the small thickness may be difficult. Particularly, the amorphous silicon layer 116 may be formed to a thickness of about 150 Å to about 300 Å. However, since the amorphous silicon layer 116 may have a thickness so that the inner portion of the first opening portion 110 may not be completely filled up, the thickness of the amorphous silicon layer 116 may not be limited to the above range. The thickness of the amorphous silicon layer 116 may be changed according to the inner width of the first opening portion 110.

Referring now to FIG. 10, N-type impurities may be doped into the amorphous silicon layer 116. The N-type impurities may include, for example, phosphor or arsenic. The phosphor may be used as the N-type impurities in some embodiments.

The doping process of the N-type impurities may include a gas phase doping process. That is, the N-type impurities may be doped into the amorphous silicon layer 116 by providing a gas source including the N-type impurities. The gas source may include, for example, phosphine ($PH_3$). Through conducting the gas phase doping process, impurity doping so as to have an impurity concentration lower than an impurity concentration by the in situ doping process may be possible.

The doping process may be conducted so that the concentration of the N-type impurities (that is, the concentration of phosphor) in the amorphous silicon layer 116 may be about $5 \times 10^{18}$ atoms/cm$^3$ to about $2 \times 10^{20}$ atoms/cm$^3$.

As similar process as discussed above with respect to FIGS. 5 through 7 may be conducted to manufacture a vertical memory device having a similar structure illustrated in FIG. 7. The vertical memory device may have improved swing properties and threshold voltage characteristics.

Comparative Experiments

The cell transistor properties of the vertical memory device in accordance with some embodiments of the present inventive concept and a common vertical memory device were compared. Furthermore, the electrical characteristics of a cell transistor with respect to the impurity doping concentration of the channel layer and the thickness of the channel layer were also compared.

Samples and comparative samples used in the experiments may have the structure of the cell transistor of the nonvolatile memory device illustrated in FIG. 6. Each of the samples and the comparative samples may have different impurity doping concentrations of the channel layer and different thicknesses of the channel layer. The impurity doping concentration of the channel layer of each of the samples and the comparative samples are as follows:

TABLE 1

|  | Sample 1 group | Sample 2 group | Sample 3 group | Comparative sample group |
| --- | --- | --- | --- | --- |
| Impurity doping concentration (atoms/cm$^3$) | 2E20 | 3E19 | 8E18 | Undoped |

The N-type impurities doped into the channel layer were phosphor. The electrical characteristics were compared by changing the thickness of the channel layer in each of sample groups and comparative sample groups.

Figure 11:
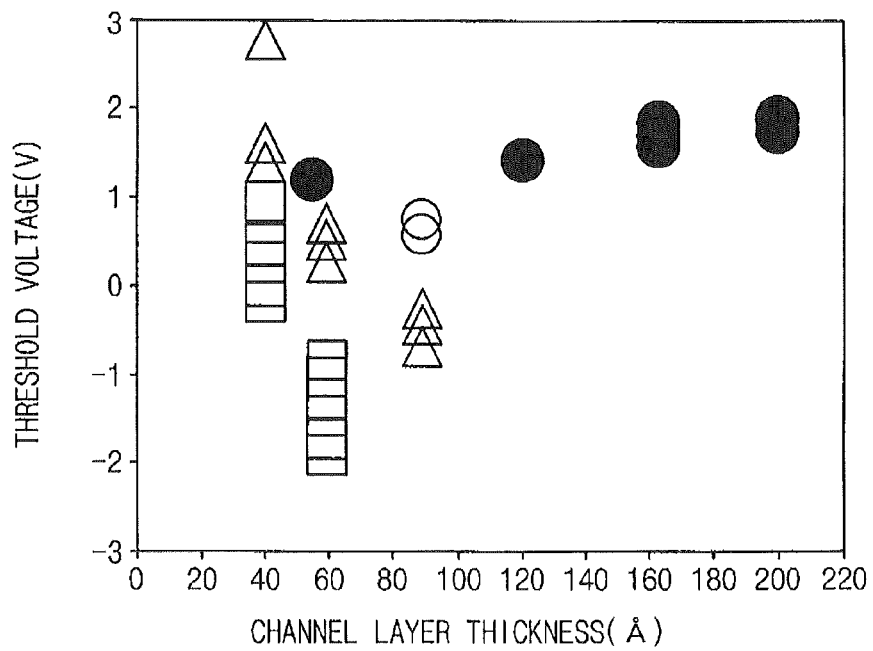
FIG. 11 is a graph illustrating threshold voltage properties of cell transistors according to doping concentrations of a channel layer and the thickness of the channel layer in samples and comparative samples.

Referring now to FIG. 11, a graph illustrating the threshold voltage properties of cell transistors according to the impurity doping concentration of a channel layer and the thickness of the channel layer in samples and comparative samples will be discussed. As illustrated therein, the threshold voltage may be increased according to the decrease of the thickness of the channel layer from the data of sample 1 group and sample 2 group.

In the graph, sample 1 group may be represented by □, sample 2 group may be represented by △, sample 3 group may be represented by ○, and comparative sample group may be represented by ●.

With respect to the data of sample 1 group, the threshold voltage was −2.0 to −1.0 V when the thickness of the channel layer was 60 Å, and the threshold voltage was increased to 0 to 1.0 V when the thickness of the channel layer was 40 Å. Even though the doping concentration of the N-type impurities of the channel layer was high to about $2\times10^{20}$ atoms/cm$^3$, as in the cell transistor of the sample 1 group, the threshold voltage may be controlled by decreasing the thickness of the channel layer.

With respect to the data of sample 2 group, the threshold voltage was −1.0 to 0 when the thickness of the channel layer was 90 Å, and the threshold voltage was increased to 1.0 to 2.0 V when the thickness of the channel layer was 40 Å.

With respect to the data of sample 3 group, when the doping concentration of the N-type impurities of the channel layer was about $8\times10^{18}$ atoms/cm$^3$, the threshold voltage was about 0.5 V when the thickness of the channel layer was 90 Å.

Meanwhile, with respect to the data of comparative sample group using an undoped channel layer, the threshold voltage was 1.0 V or over when the thickness of the channel layer was 200 Å. Furthermore, when the thickness of the channel layer was decreased, the threshold voltage decreased.

From the results of the experiments, the cell transistors of sample group 1 to sample group 3 in accordance with some embodiments of the present inventive concept have a channel layer having smaller thickness than the cell transistor of a common structure. Furthermore, it would be found that the threshold voltage may be controlled through controlling the thickness of the channel layer.

Figure 12:
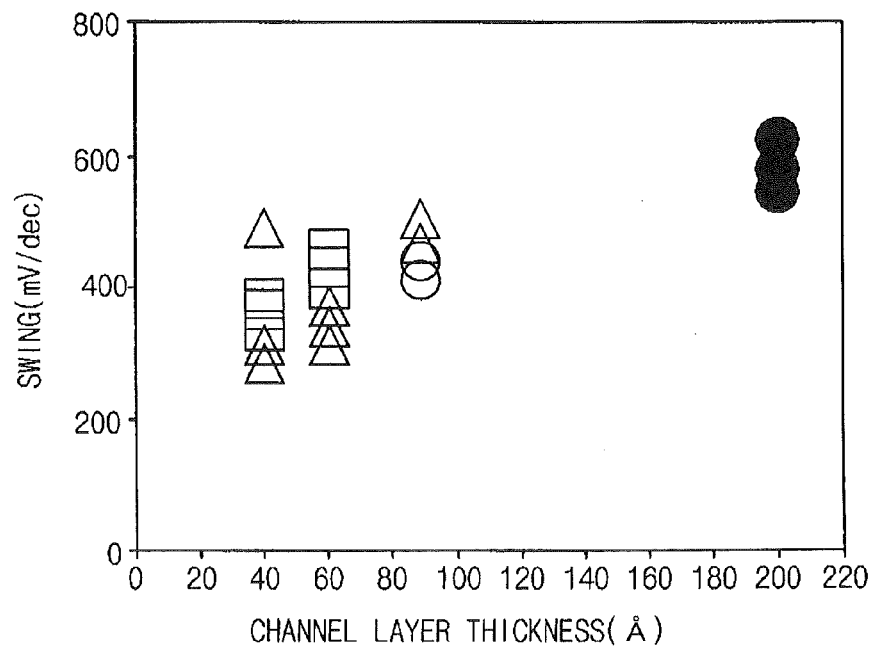
FIG. 12 is a graph illustrating swing properties of cell transistors according to doping concentrations of a channel layer and the thickness of the channel layer in samples and comparative samples.

Referring now to FIG. 12, a graph illustrating swing properties of cell transistors according to the impurity doping concentration of a channel layer and thickness of the channel layer in samples and comparative samples will be discussed. In the graph, sample 1 group may be represented by □, sample 2 group may be represented by △, sample 3 group may be represented by ○, and comparative sample group may be represented by ●.

As illustrated in FIG. 12, good swing properties may be found to be obtained in sample 1 group to sample 3 group. Particularly, the swing properties may be improved as the thickness of the channel layer decreases.

On the contrary, the swing properties for comparative sample group were deteriorated when compared with sample 1 group to sample 3 group.

From the results of the experiments, the cell transistors of sample 1 group to sample 3 group in accordance with some embodiments of the present inventive concept exhibited better swing properties than the cell transistors of a common structure. Thus, according to some embodiments of the present inventive concept, a vertical memory device having improved swing properties and threshold voltages may be provided.

The foregoing is illustrative of some embodiments and is not to be construed as limiting thereof. Although a few example embodiments have been described, those skilled in the art will readily appreciate that many modifications are possible in some embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of fabricating a vertical memory device, comprising:
    forming a plurality of alternating insulating layers and sacrificial layers on a substrate;
    patterning and etching the plurality of insulating layer and sacrificial layers to define an opening that exposes at least a portion of a surface of the substrate;
    forming a charge trapping pattern and a tunnel insulating pattern on a side wall of the opening;
    forming a channel layer on the tunnel insulating layer on the sidewall of the opening, the channel layer including N-type impurity doped polysilicon;
    forming a buried insulating pattern on the channel layer in the opening; and forming a blocking dielectric layer and a control gate on the charge trapping pattern of one side wall of the channel layer, wherein the forming of the channel layer comprises:

forming an undoped amorphous silicon layer on the tunnel insulating pattern;

implanting N-type impurities into the undoped amorphous silicon layer to provide a doped amorphous silicon layer;

crystallizing the doped amorphous silicon layer to form a polysilicon layer; and partially etching the polysilicon layer provide the channel layer.

2. The method of claim 1, wherein doping of the N-type impurities comprises a gas phase doping process.

3. The method of claim 2, wherein a doping gas used in the gas phase doping process comprises Phosphine ($PH_3$).

4. The method of claim 1, wherein crystallization comprises a thermal treatment process.

5. The method of claim 1, wherein partially etching the polysilicon layer comprises isotropically etching the polysilicon layer.

6. The method of claim 1, wherein the N-type impurities implanted in the channel layer comprise phosphor.

7. The method of claim 6, wherein a doping concentration of the N-type impurities implanted in the channel layer is from about $5 \times 10^{18}$ atoms/cm$^3$ to about $2 \times 10^{20}$ atoms/cm$^3$.

8. The method of claim 1, wherein the channel layer has a thickness of from about 30 Å to about 90 Å.

9. A method of fabricating a vertical memory device, comprising:

forming a plurality of alternating insulating layers and sacrificial layers on a substrate;

patterning and etching the plurality of insulating layer and sacrificial layers to define an opening that exposes at least a portion of a surface of the substrate;

forming a charge trapping pattern and a tunnel insulating pattern on a side wall of the opening; and forming a channel layer on the tunnel insulating pattern, the channel layer having a thickness of from about 30 Å to about 90 Å, wherein the forming of the channel layer comprises:

forming an undoped amorphous silicon layer on the tunnel insulating pattern;

implanting N-type impurities into the undoped amorphous silicon layer to provide a doped amorphous silicon layer; and crystallizing the doped amorphous silicon layer to form a polysilicon layer.

10. The method of claim 9, wherein the channel layer comprises N-type impurity doped polysilicon, the method further comprising:

forming a buried insulating pattern on the channel layer in the opening; and forming a blocking dielectric layer and a control gate on the charge trapping pattern of one side wall of the channel layer.

11. The method of claim 9, wherein the N-type impurities implanted in the channel layer comprise phosphor.

12. The method of claim 9, wherein doping of the N-type impurities comprises a gas phase doping process and wherein a doping gas used in the gas phase doping process comprises Phosphine ($PH_3$).

13. The method of claim 9, wherein crystallization comprises a thermal treatment process.

14. The method of claim 9, further comprising partially etching the polysilicon layer to provide the channel layer, wherein partially etching the polysilicon layer comprises isotropically etching the polysilicon layer.

* * * * *